United States Patent
Doerner

(10) Patent No.: US 9,465,692 B2
(45) Date of Patent: Oct. 11, 2016

(54) HIGH RELIABILITY ERASURE CODE DISTRIBUTION

(71) Applicant: Quantum Corporation, San Jose, CA (US)

(72) Inventor: Don Doerner, San Jose, CA (US)

(73) Assignee: Quantum Corporation, San Jose, CA (US)

( * ) Notice: Subject to any disclaimer, the term of this patent is extended or adjusted under 35 U.S.C. 154(b) by 26 days.

(21) Appl. No.: 14/314,977

(22) Filed: Jun. 25, 2014

(65) Prior Publication Data

US 2015/0378820 A1    Dec. 31, 2015

(51) Int. Cl.
*G11C 29/00* (2006.01)
*G06F 11/10* (2006.01)

(52) U.S. Cl.
CPC ................................. *G06F 11/1076* (2013.01)

(58) Field of Classification Search
CPC ................................................ G06F 11/1076
See application file for complete search history.

(56) References Cited

U.S. PATENT DOCUMENTS

| | | | | |
|---|---|---|---|---|
| 2008/0005508 | A1* | 1/2008 | Asano | G06F 3/0605 711/161 |
| 2011/0029840 | A1* | 2/2011 | Ozzie | G06F 11/1004 714/763 |
| 2012/0014015 | A1* | 1/2012 | Anderson | G11B 5/012 360/73.03 |
| 2012/0072640 | A1* | 3/2012 | Crawford | G06F 3/0607 711/103 |
| 2013/0290624 | A1* | 10/2013 | Crawford | G06F 3/0607 711/112 |

* cited by examiner

*Primary Examiner* — Bryce Bonzo
*Assistant Examiner* — Thien D Nguyen
(74) *Attorney, Agent, or Firm* — Eschweiler & Associates, LLC

(57) ABSTRACT

Example apparatus and methods treat some erasure codes differently than other erasure codes. For example, erasure codes that are only involved in error-recovery may never be read and thus may be stored using a different approach than erasure codes that are involved in more regular data reading. If different types of data stores are available, then the erasure codes that are more likely to be read may be stored in data stores having a first (e.g., higher, faster) type of read performance while the erasure codes that are less likely to be read may be stored in data stores having a second (e.g., lower, slower, less expensive) type of read performance. Different data stores may be located on different data storage devices. Different data stores may even be located on a single data storage device.

28 Claims, 10 Drawing Sheets

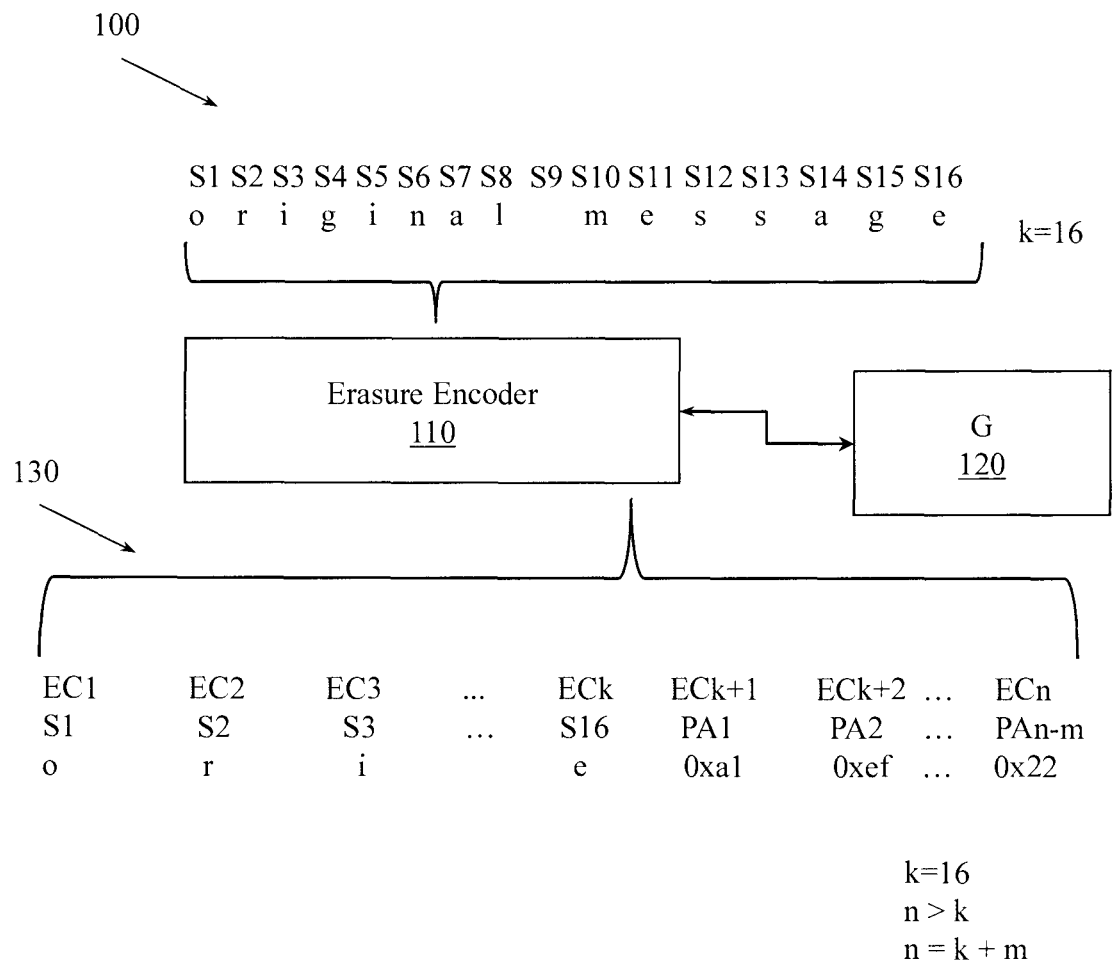
Prior Art Figure 1

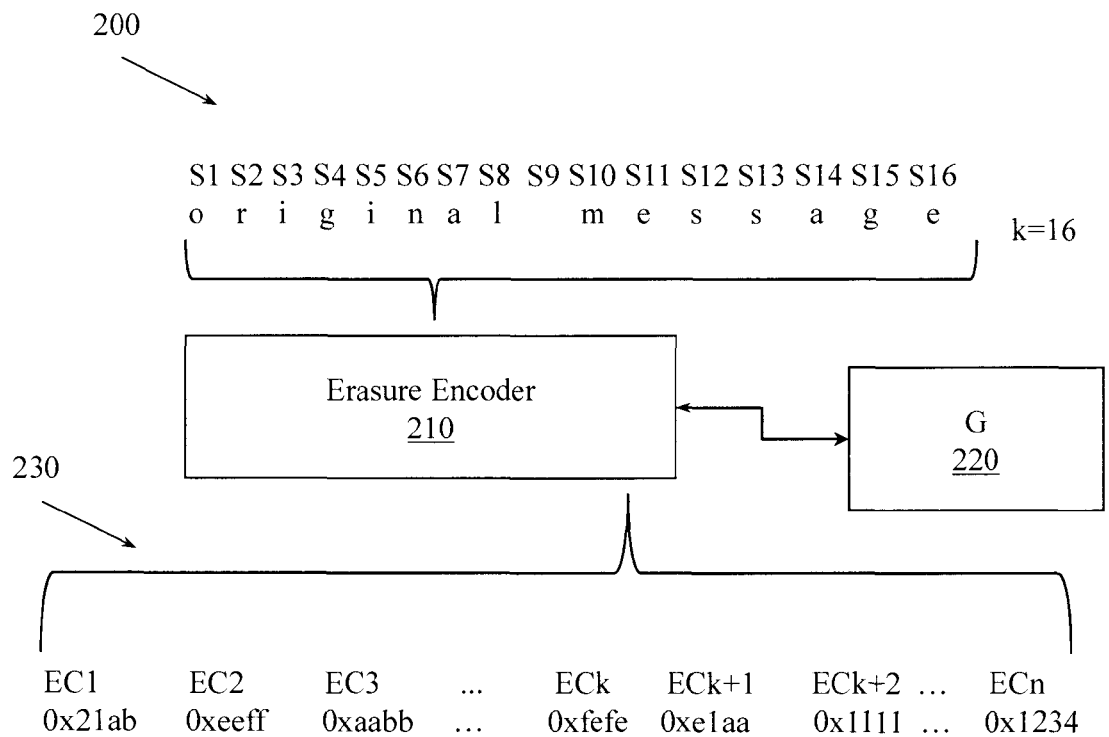
Prior Art Figure 2

300

| $\gamma_{1,1}$ | $\gamma_{1,2}$ | $\gamma_{1,3}$ | ... | |
|---|---|---|---|---|
| $\gamma_{2,1}$ | $\gamma_{2,2}$ | $\gamma_{2,3}$ | ... | $\gamma_{2,K}$ |
| $\gamma_{3,1}$ | $\gamma_{3,2}$ | $\gamma_{3,3}$ | ... | $\gamma_{3,K}$ |
| ... | ... | ... | ... | ... |
| $\gamma_{N,1}$ | $\gamma_{N,2}$ | $\gamma_{N,3}$ | ... | $\gamma_{N,K}$ |

| 1 | 0 | 0 | ... | 0 |
| --- | --- | --- | --- | --- |
| 0 | 1 | 0 | ... | 0 |
| 0 | 0 | 1 | ... | 0 |
| ... | ... | ... | ... | ... |
| $\gamma_{K+1,1}$ | $\gamma_{K+1,2}$ | $\gamma_{K+1,3}$ | ... | $\gamma_{K+1,K}$ |
| ... | ... | ... | ... | ... |
| $\gamma_{N,1}$ | $\gamma_{N,2}$ | $\gamma_{N,3}$ | ... | $\gamma_{N,K}$ |

Prior Art Figure 4

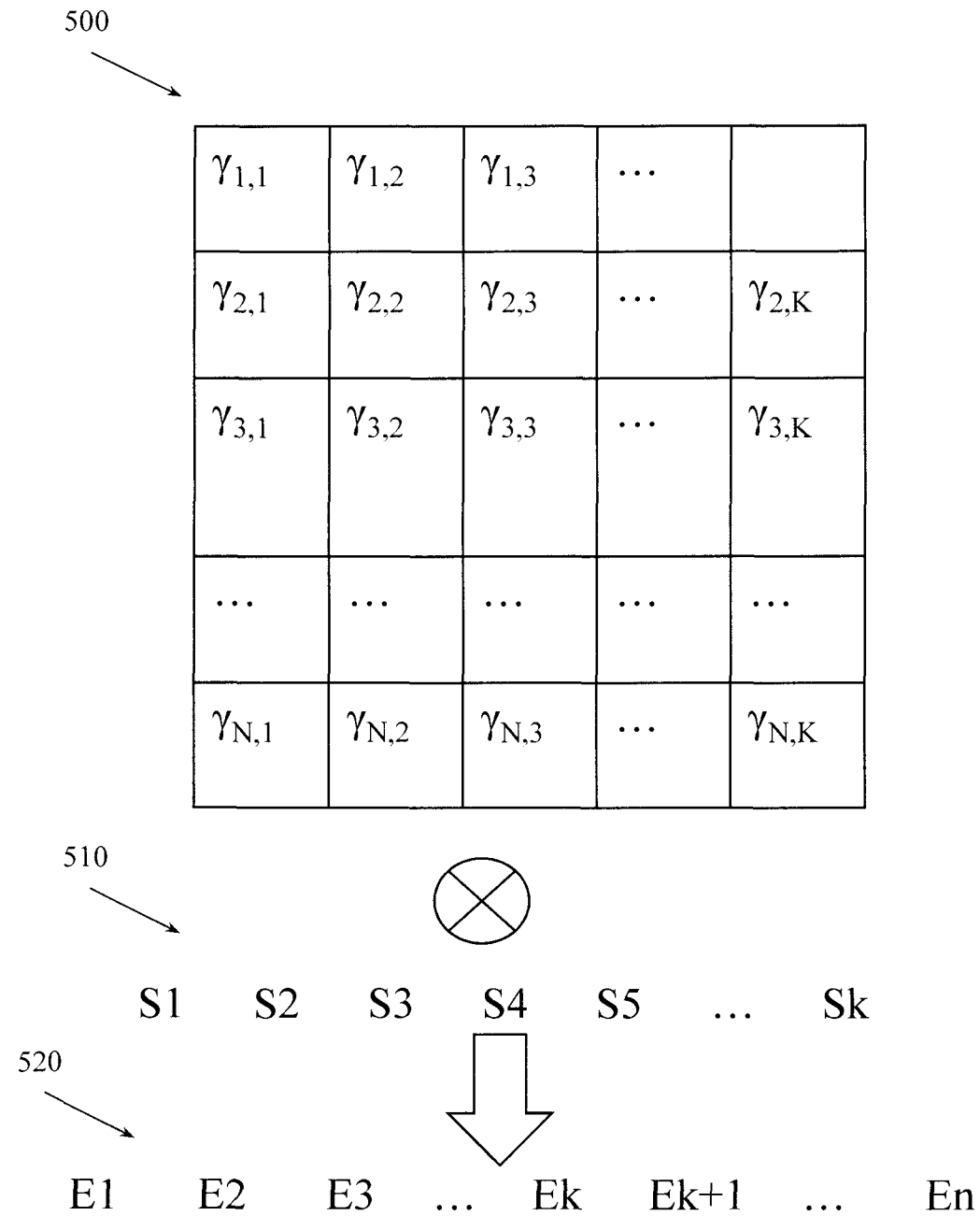
Prior Art Figure 5

HIGH RELIABILITY ERASURE CODE DISTRIBUTION

BACKGROUND

Data that is stored or transmitted may be protected against storage media failures or other loss by storing extra copies, by storing additional redundant information, or in other ways. One type of redundancy based protection involves using erasure coding. Erasure coding uses additional redundant data to produce erasure codes that protect against 'erasures' where data portions that are lost can be reconstructed from the surviving data. The application of erasure codes to data storage may typically have been for the purpose of recovering data in the face of failures of hardware elements storing the data. Redundant arrays of independent disks (RAID) storage systems have protected data using systematic erasure codes.

Adding redundancy introduces overhead that consumes more storage capacity or transmission bandwidth, which in turn adds cost. The overhead added by erasure code processing tends to increase as the protection level provided increases. To enhance data protection, different approaches for storing redundant copies of items have been employed. Erasure codes are one such approach. An erasure code is a forward error correction (FEC) code for the binary erasure channel. The FEC facilitates transforming a message of k symbols into a longer message with n symbols so that the original message can be recovered from a subset of the n symbols, k and n being integers, n>k. The symbols may be individual items (e.g., characters, bytes) or groups of items. The original message may be, for example, a file. The fraction r=k/n is called the code rate, and the fraction k'/k, where k' denotes the number of symbols required for recovery, is called the reception efficiency. Optimal erasure codes have the property that any k out of the n code word symbols are sufficient to recover the original message. Optimal codes may require extensive memory usage, CPU time, or other resources when n is large. Erasure coding approaches may seek to create the greatest level of protection with the least amount of overhead via optimal or near optimal coding. Different types of erasure codes have different efficiencies and tradeoffs in terms of complexity, resources, and performance.

Erasure codes are described in coding theory. Coding theory is the study of the properties of codes and their fitness for a certain purpose (e.g., backing up files). Codes may be used for applications including, for example, data compression, cryptography, error-correction, and network coding. Coding theory involves data compression, which may also be referred to as source coding, and error correction, which may also be referred to as channel coding. Fountain codes are one type of erasure code.

Fountain codes have the property that a potentially limitless sequence of encoding symbols may be generated from a given set of source symbols in a manner that supports ideally recovering the original source symbols from any subset of the encoding symbols having a size equal to or larger than the number of source symbols. A fountain code may be optimal if the original k source symbols can be recovered from any k encoding symbols, k being an integer. Fountain codes may have efficient encoding and decoding algorithms that support recovering the original k source symbols from any k' of the encoding symbols with high probability, where k' is just slightly larger than k. A rateless erasure code is distinguished from an erasure code that exhibits a fixed code rate.

Storage systems may employ rateless erasure code technology (e.g., fountain codes) to provide a flexible level of data redundancy. The appropriate or even optimal level of data redundancy produced using a rateless erasure code system may depend, for example, on the number and type of devices available to the storage system. The actual level of redundancy achieved using a rateless erasure code system may depend, for example, on the difference between the number of readable redundancy blocks (e.g., erasure codes) written by the system and the number of redundancy blocks needed to reconstruct the original data. For example, if twenty redundancy blocks are written and only eleven redundancy blocks are needed to reconstruct the original data that was protected by generating and writing the redundancy blocks, then the original data may be reconstructed even if nine of the redundancy blocks are damaged or otherwise unavailable. This may be referred to as an "11 of 20" erasure code system.

An erasure code (EC) system may be described using an A/B notation, where B describes the total number of encoded symbols that can be produced for an input message and A describes the minimum number of the B encoded symbols that are required to recreate the message for which the encoded symbols were produced. By way of illustration, in a 10 of 16 configuration, or EC 10/16, sixteen encoded symbols could be produced. The 16 encoded symbols could be spread across a number of drives, nodes, or geographic locations. The 16 encoded symbols could even be spread across 16 different locations. In the EC 10/16 example, the original message could be reconstructed from 10 verified fragments. Conventionally, the 16 encoded symbols have been treated equally.

Prior Art FIG. 1 illustrates an example set of systematic erasure codes. Prior Art FIG. 1 illustrates an original message 100 that has sixteen symbols S1, S2, . . . S16 (k=16) and that reads "original message". While the symbol size is one character, different symbol sizes may be employed. Message 100 is provided to erasure encoder 110. Erasure encoder 110 uses a generator matrix 120 to produce erasure codes 130. In this example, erasure encoder 110 produces erasure codes EC1, EC2, . . . ECn (n>k). The erasure codes include systematic erasure codes EC1 . . . EC16 (EC1 . . . ECk), which correspond directly to S1 . . . S16 (S1 . . . Sk). In this embodiment, at least EC1 . . . EC16 may be the same size as S1 . . . S16. For example, if the symbols S1 . . . S16 are one byte each, then the symbols EC1 . . . EC16 may also be one byte each. The erasure codes also include EC17 . . . ECn (ECk+1 . . . ECn), which do not correspond to any of S1 . . . Sk. In one embodiment, ECk+1 . . . ECn may be parity information. In another embodiment, ECk+1 . . . ECn may be other information that facilitates recreating the original message. In this embodiment, ECk+1 . . . ECn do not need to be the same size as S1 . . . S16. For example, if S1 . . . S16 are one byte, ECk+1 . . . ECn do not have to be one byte. While the systematic erasure codes are illustrated as being generated in order and in locations directly corresponding to the input message, in some embodiments, the systematic erasure codes may be distributed through the ECn codes and may be out of order.

The original message 100 can be recreated from any 16 of the systematic erasure codes EC1 . . . ECn. If EC1 . . . ECk are available, then original message 100 can be recreated without performing erasure code decoding. If any of EC1 . . . ECk are not available, then original message 100 can still be recreated but erasure code decoding would be necessary for at least one of ECk+1 . . . ECn.

Prior Art FIG. 2 illustrates an example set of non-systematic erasure codes. Prior Art FIG. 2 illustrates an original message 200 that also has sixteen symbols S1, S2, . . . S16 (k=16) and that reads "original message". While the symbol size is one character, different (e.g., larger) symbol sizes are likely to be employed. Message 200 is provided to erasure encoder 210. Erasure encoder 210 uses a generator matrix 220 to produce erasure codes 230. In this example, erasure encoder 210 produces non-systematic erasure codes EC1, EC2, . . . ECn (n>k). EC1, EC2, . . . ECn do not correspond directly to any of S1 . . . S16 as was the case for systematic erasure codes 130 (Prior Art FIG. 1). Instead, EC1, EC2, . . . ECn are the result of processing symbols S1 . . . S16 with the matrix 220 as controlled by erasure encoder 210. EC1, EC2, . . . ECn do not have to be the same size as S1 . . . S16. For example, S1 . . . S16 may be one byte each that represent one ASCII character each while EC1, EC2, . . . ECn are two bytes each.

Prior Art FIG. 3 illustrates a generator matrix 300. Typically, an erasure coder uses a generator matrix like matrix 300 for encoding data. An input message (e.g., plaintext) and the generator matrix 300 may be processed to produce erasure codes. For example, an input message and generator matrix 300 may be multiplied together using matrix multiplication to produce erasure codes.

Prior Art FIG. 4 illustrates a generator matrix 400 for a systematic erasure code system where the upper sub-matrix is an identity matrix. When the systematic erasure code system uses generator matrix 400, some of the erasure codes produced may be symbols from the input message. Thus, for systematic erasure codes, the encoded symbols may be denoted [Sk:En] to reflect the fact that some encoded symbols are actually the original data (e.g., plaintext).

Prior Art FIG. 5 illustrates example erasure code generation using a generator matrix 500 and an input message 510. The input message 510 is multiplied by generator matrix 500 using matrix multiplication to produce erasure codes 520. While the input message 510 had k symbols, the erasure codes 520 may have n symbols, where n>=k. In general, at least k symbols are required to decode the data. Decoding processes may vary by erasure code approach. For a systematic erasure code approach, if the erasure codes corresponding to the original input symbols are available, then no "decoding" is required, only re-assembly is required.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Prior Art FIG. 1 illustrates an example set of systematic erasure codes.

Prior Art FIG. 2 illustrates an example set of non-systematic erasure codes.

Prior Art FIG. 3 illustrates a generator matrix.

Prior Art FIG. 4 illustrates a generator matrix for a systematic erasure code system where the upper sub-matrix is an identity matrix.

Prior Art FIG. 5 illustrates an example erasure code generation using a generator matrix and an input message.

DETAILED DESCRIPTION

Figure 6:
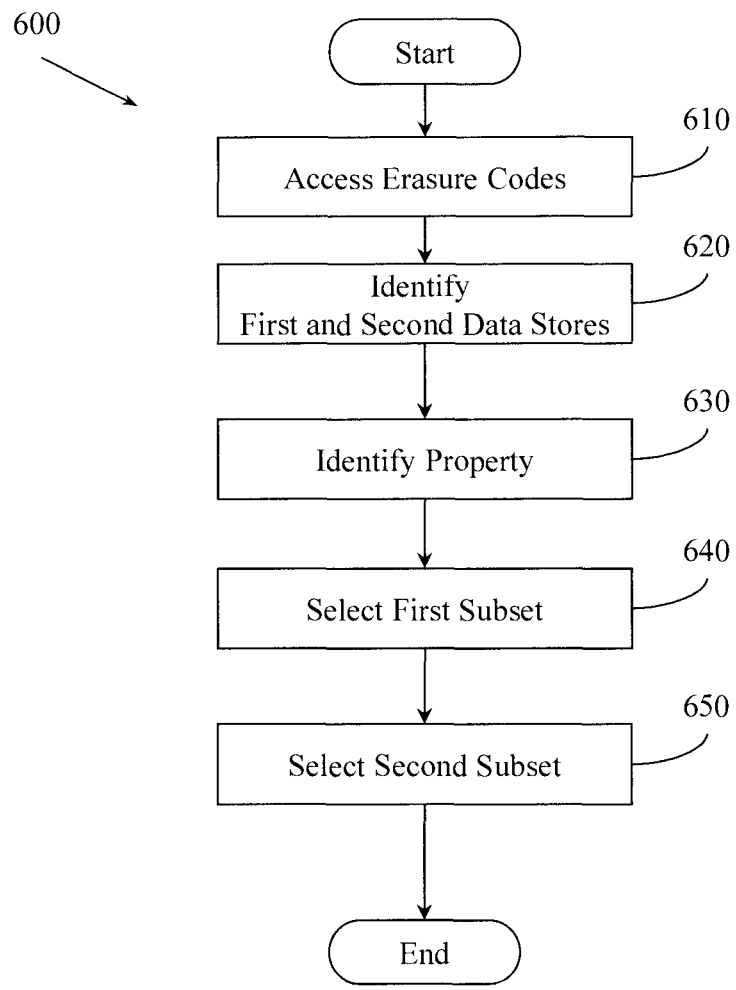
FIG. 6 illustrates an example method associated with high reliability erasure code distribution.

Example apparatus and methods treat members of a set of erasure codes differently. Erasure codes may be distributed to different types of data stores to improve reliability for erasure code distribution. Erasure codes may also be distributed to different types of data stores to increase a utility measure for storing or recalling erasure codes. By way of illustration, erasure codes that are only involved in error-recovery may hopefully never be read and thus may be stored using a different approach than erasure codes that are more regularly read. If different types of data stores are available, then the erasure codes that are more likely to be read may be stored in data stores having a first (e.g., higher, faster) type of read performance while the erasure codes that are less likely to be read may be stored in data stores having a second (e.g., lower, slower, less expensive) type of read performance. Different data stores may be located on different data storage devices. Different data stores may even be located on a single data storage device.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders or concurrently with other blocks from that shown and described. Moreover, less than all the illustrated blocks may be required to implement an example methodology. Blocks may be combined or separated into multiple components. Furthermore, additional or alternative methodologies can employ additional, not illustrated blocks.

FIG. 6 illustrates a method 600 associated with high reliability erasure code distribution. Method 600 may include, at 610, accessing a set of n erasure codes generated for a message having k symbols, n and k being numbers, n being greater than or equal to k. Accessing the set of n erasure codes may include reading the codes from a memory or file or other data store, receiving the codes in a function call, receiving a pointer to the erasure codes, receiving an address to a table in which the erasure codes are stored, or other computer-based action.

Method 600 may also include, at 620, identifying a first data store and a second data store that are available to store members of the set of n erasure codes. The data stores may have different operating characteristics that may be exploited to improve erasure code distribution with respect to, for example, read speed, write speed, reliability, cost, or other factors.

Method 600 may also include, at 630, identifying a property associated with both the first data store and the second data store. Once the property has been identified, method 600 may include identifying a first value for the property for the first data store and identifying a second value for the property for the second data store. Once the values for the properties have been identified, decisions about where to store different types or amounts of erasure codes may be made based on the values.

In one embodiment, the property is a speed with which an erasure code can be read from a data store. When the property is read speed, method 600 may cause erasure codes that are most frequently read or most likely to be most frequently read to be stored in a data store from which erasure codes can be read faster. Similarly, method 600 may put erasure codes that are less frequently read or less likely to be frequently read in a data store from which erasure codes are read more slowly.

In one embodiment, the property is a speed with which an erasure code can be written to a data store. For example, in some applications being able to store certain types of erasure codes as quickly as possible may be more important than being able to retrieve those erasure codes. In this case, some erasure codes may be written to devices with fast write times and other erasure codes may be written to devices with slower write times.

In one embodiment, the property may be a combination of a speed with which an erasure code can be read from a data store and a speed with which an erasure code can be written to a data store. Other combinations of properties may be considered. For example, the property may be a cost for storing an erasure code on a data store.

In different examples, the first subset and the second subset may or may not be mutually exclusive. In one embodiment, the first subset and the second subset are selected to maximize a utility measure that is a function of an erasure code read time, an erasure code write time, or an erasure code storage cost.

Method 600 may also include, at 640, selecting a first subset of the set of erasure codes to store in the first data store based, at least in part, on the first value or the second value. For example, erasure codes that are more suited to the value of the property for the first data store may be targeted for the first data store while erasure codes that are more suited to the value of the property for the second data store may be targeted for the second data store. Thus, method 600 may also include, at 650, selecting a second subset of the set of erasure codes to store in the second data store based, at least in part, on the first value or the second value.

In one embodiment, a member of the set of n erasure codes has an associated read probability that describes how likely the member is to be read. In this embodiment, the first subset may be selected so that members of the set of n erasure codes having a read probability above a threshold are stored on the first data store. In this embodiment, the second subset may be selected so that members of the set of n erasure codes having a read probability below a threshold are stored on the second data store.

In one embodiment, the set of n erasure codes may be systematic erasure codes. In this set of n systematic erasure codes, a k sized subset of the n erasure codes are erasure codes from which the message m can be reconstructed without decoding an erasure code. An n-k sized subset of the n erasure codes that is mutually exclusive with the k sized subset are erasure codes from which the message m can be reconstructed based, at least in part, on decoded members of the n-k sized subset. In this embodiment, a system may be designed so that the erasure codes from which the message can be reconstructed without doing any erasure code decoding are read more often than erasure codes that require decoding. Thus, in one embodiment, the first subset is the k sized subset and the second subset is the n-k sized subset. In another embodiment, the first subset includes at least the k sized subset and the second subset includes at least the n-k sized subset.

Some erasure codes may be more likely to be read than other erasure codes. Thus, in one embodiment, a member of the set of n erasure codes has an associated read probability that describes how likely the member is to be read. In this embodiment, the first subset is selected so that members of the set of n erasure codes having a read probability above a threshold are stored on the first data store and the second subset is selected so that members of the set of n erasure codes having a read probability below a threshold are stored on the second data store. While two data stores are described, two or more data stores having two or more different properties may be considered and two or more subsets of erasure codes may be stored on members of the two or more data stores based, at least in part, on the values of the two or more different properties.

Figure 7:
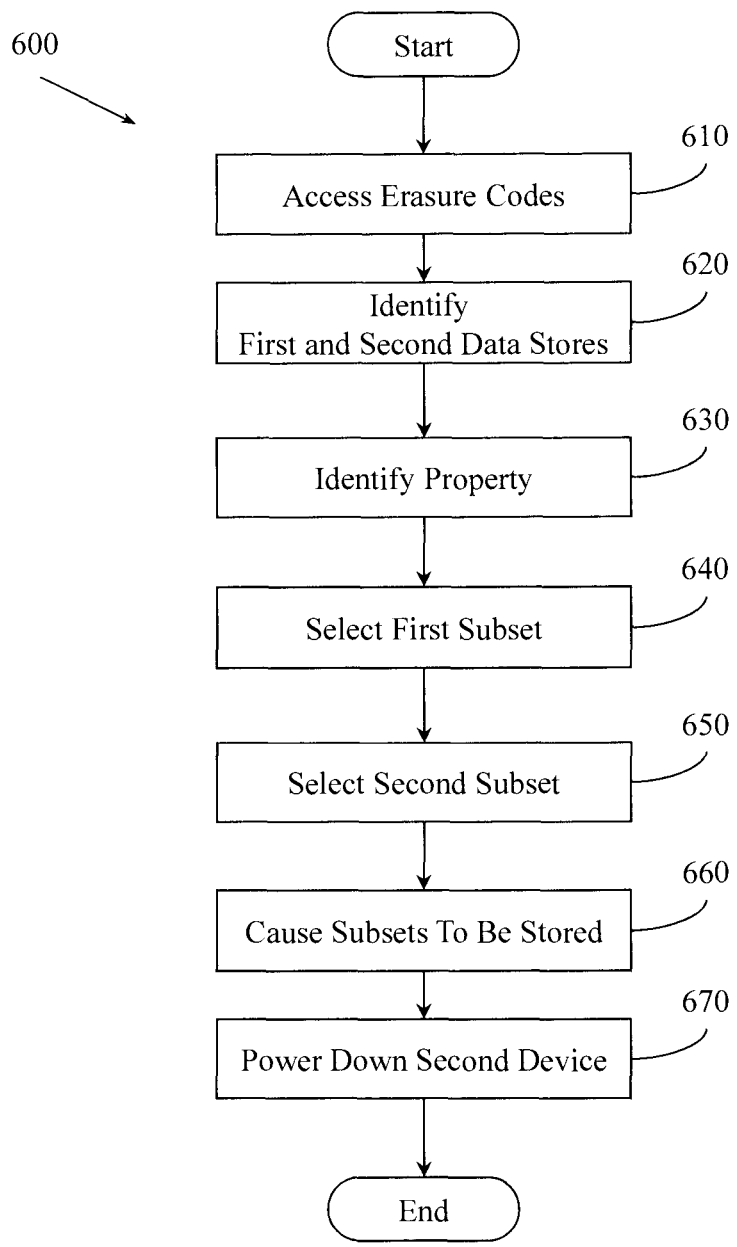
FIG. 7 illustrates an example method associated with high reliability erasure code distribution.

FIG. 7 illustrates another embodiment of method 600. This embodiment also includes, at 660, causing the first subset to be stored on the first data store and causing second subset to be stored on the second data store. Causing the first subset to be stored may include, for example, writing an erasure code to a register, providing the erasure code to a process, sending the erasure code as a packet, placing the erasure code in a database or other computer-based actions. Similarly, causing the second subset to be stored may include, for example, writing an erasure code to a register, providing the erasure code to a process, sending the erasure code as a packet, or other actions.

Since the second subset may be designated for storage on the second data store because, hopefully, it will be unlikely that the second subset will be read, this embodiment may also include, at 670, selectively powering down the second data store after the second subset has been stored on the second data store.

In one embodiment, the first data store and the second store are located on the same data storage device. For example, the first data store may be located on cylinders on the outer half of a hard disk drive and the second data store may be located on cylinders on the inner half of the hard disk drive. In other embodiments, the first and second data stores may be located on different devices.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar terms, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable storage medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, or other repository. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include, for example, a software controlled microprocessor, a discrete logic (e.g., ASIC), an analog circuit, a digital circuit, a programmed logic device, or a memory device containing instructions. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Object", as used herein, refers to the usage of object in computer science. From one point of view, an object may be considered to be a location in a physical memory having a value and referenced by an identifier.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, or programs including separate applications or code from dynamically linked libraries.

"User", as used herein, includes but is not limited to one or more persons, software, logics, applications, computers or other devices, or combinations of these.

Figure 8:
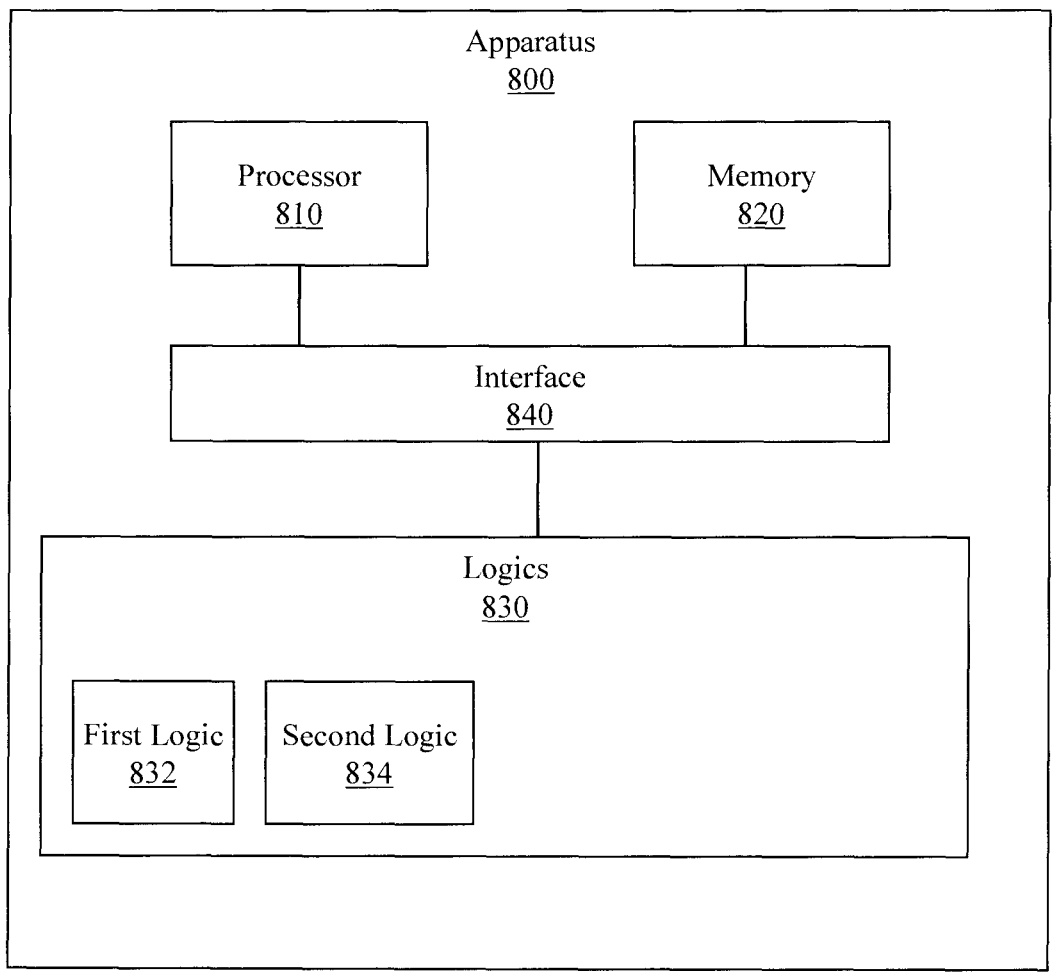
FIG. 8 illustrates an example apparatus associated with high reliability erasure code distribution.

FIG. 8 illustrates an apparatus 800 that includes a processor 810, a memory 820, and a set 830 of logics that is connected to the processor 810 and memory 820 by an interface 840. In one embodiment, the apparatus 800 may be a stand-alone device connected to a data communication network. In another embodiment, apparatus 800 may be integrated into another device (e.g., deduplication apparatus) or system (e.g., object storage system). The set 830 of logics control how erasure codes are stored on a plurality of data storage devices.

The set 830 of logics may include a first logic 832 that produces a characterization of an operating parameter for members of the plurality of data storage devices. The operating parameter may be, for example, write speed, read speed, storage capacity, or storage cost. The plurality of data storage devices may include, for example, a hard disk drive, a solid state drive, a tape drive, or a virtual storage device located in the cloud. In one embodiment, the read utility measure is a function of a probability that an erasure code will be read and a time required to read the erasure code. In one embodiment, the first logic 832 produces a ranking of the plurality of data storage devices with respect to the parameters.

The apparatus 800 may also include a second logic 834 that selectively causes the erasure codes to be stored on different members of the plurality of data storage devices based, at least in part, on the characterization of the operating parameters. In one embodiment, the second logic 834 causes the erasure codes to be stored on selected members of the plurality of data storage devices to maximize a read utility measure. The read utility measure may be a combination of read time, write time, read cost, write cost, or other factors.

In one embodiment, the second logic 834 causes the erasure codes to be stored on different members of the plurality of data storage devices based, at least in part, on the ranking produced by the first logic 832. For example, erasure codes having a highest value may be stored on data storage devices that rank highest in a value related measure while erasure codes having a lower value may be stored on data storage devices having lower rankings.

Figure 9:
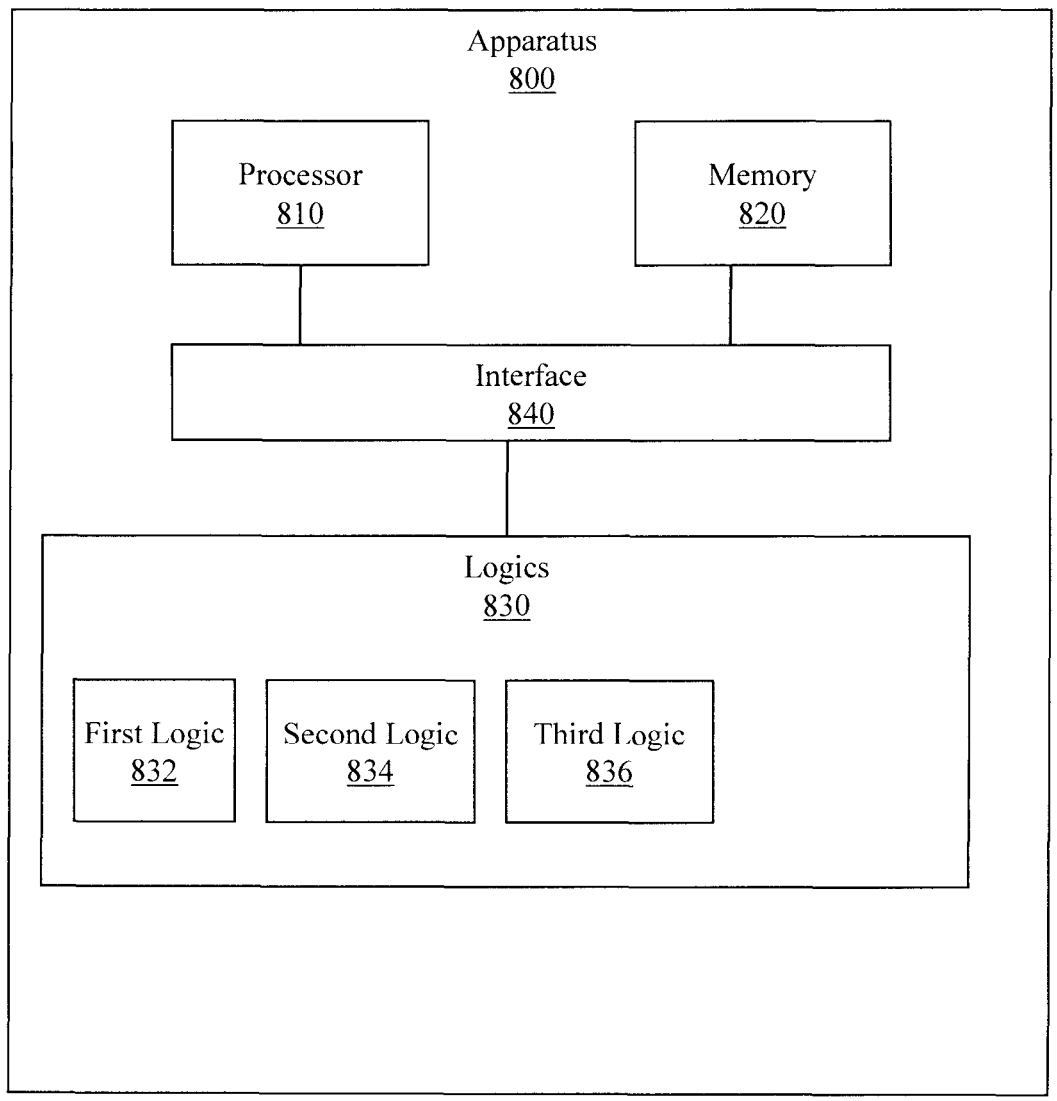
FIG. 9 illustrates an example apparatus associated with high reliability erasure code distribution.

FIG. 9 illustrates another embodiment of apparatus 800. This embodiment includes a third logic 836. The third logic 836 produces a re-characterization of the operating parameters for the plurality of data storage devices. The re-characterization may be performed on a schedule, upon the occurrence of an event (e.g., disk crash, disk reaching a threshold capacity), under user control, or at other times. The re-characterization provides data upon which an updated decision concerning erasure code distribution can be made. Thus, the third logic 836 may cause the second logic 834 to selectively move an erasure code from a current data storage device to a different data storage device based, at least in part, on the re-characterization.

Figure 10:
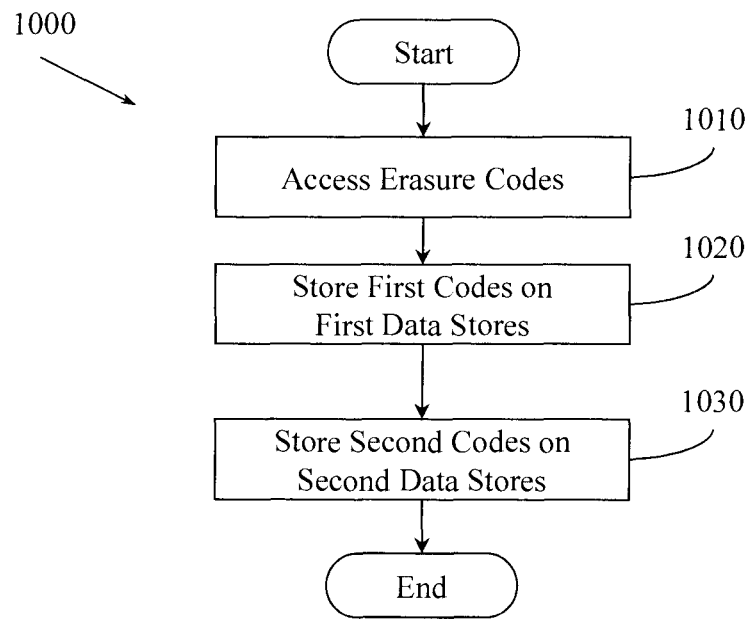
FIG. 10 illustrates an example method associated with high reliability erasure code distribution.

FIG. 10 illustrates a method 1000 associated with high reliability erasure code distribution. Method 1000 includes, at 1010, accessing a set of systematic erasure codes. Accessing the erasure codes may include reading the codes from a memory, reading codes from a data store, receiving the codes in a function call, receiving the codes as a computer communication, or other computer based action.

Method 1000 also includes, at 1020, storing members of the set of systematic erasure codes from which a message can be reconstructed without erasure code decoding on a first data store. Being able to reconstruct the message without erasure code decoding means, for example, that plaintext symbols from the original message that are stored in erasure codes may simply by grouped (e.g., concatenated) together without having to an inverse process that involves the generator matrix. Storing erasure codes may include writing the erasure codes to a disk, writing the erasure codes to a tape, writing the erasure codes to a memory, providing the erasure codes in a function call, or other computer based action.

Method 1000 also includes, at 1030, storing members of the set of systematic erasure codes from which the message can be reconstructed using erasure code decoding on a second data store. Reconstructing the message using erasure code decoding may involve performing an inverse operation involving the generator matrix. Storing erasure codes may include writing the erasure codes to a disk, writing the erasure codes to a tape, writing the erasure codes to a memory, providing the erasure codes in a function call, or other computer based action.

In one embodiment, the first and second data stores are selected based on the speed with which an erasure code can be read from the data store. For example, a member of the set of systematic erasure codes from which a message can be reconstructed without erasure code decoding will be stored on the first data store because the erasure code can be read from the first data store faster. Similarly, a member of the set of systematic erasure codes from which a message can be reconstructed using erasure code decoding will be stored on the second data store because the second data store is slower.

Various combinations of devices may be designated as the first data store and the second data store. The designation may depend, for example, on the read speed for a device. Thus, in one example, the first data store is a solid state drive and the second data store is a hard disk drive. In another example, the first data store is a hard disk drive and the second data store is a tape. In another example, the first data store is a hard disk drive and the second data store is the cloud. In yet another example, the first data store is located on cylinders closer to the outside of a hard disk drive than cylinders on the hard disk drive associated with the second data store. Other devices and combinations of devices may be employed.

In one embodiment, when the second subset includes less than enough erasure codes to reconstruct the message, at least a portion of the second subset may be stored in an unencrypted fashion. In this embodiment, the second data store may be a publicly accessible data store (e.g., reside in the cloud). The term "cloud" refers to a network of servers and other devices that are publicly accessible.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A non-transitory computer-readable storage medium storing computer-executable instructions that when executed by a computer cause the computer to perform a method, the method comprising:
    accessing a set of n erasure codes generated for a message having k symbols, n and k being numbers, n being greater than or equal to k;
    identifying a first data store that is available to store members of the set of n erasure codes, where the first data store is located on cylinders on the outer half of a hard disk drive;
    identifying a second data store that is available to store members of the set of n erasure codes, where the second data store is located on cylinders on the inner half of a hard disk drive;
    identifying a property associated with both the first data store and the second data store, where the property is a speed with which an erasure code can be read from a data store, or where the property is a speed with which an erasure code can be written to a data store;
    identifying a first value for the property for the first data store;
    identifying a second value for the property for the second data store;
    selecting a first subset of the set of erasure codes to store in the first data store based, at least in part, on the first value or the second value, and selecting a second subset of the set of erasure codes to store in the second data store based, at least in part, on the first value or the second value.

2. The non-transitory computer-readable storage medium of claim 1, where the property is a combination of a speed with which an erasure code can be read from a data store and a speed with which an erasure code can be written to a data store.

3. The non-transitory computer-readable storage medium of claim 1, where the property is a cost for storing an erasure code on a data store.

4. The non-transitory computer-readable storage medium of claim 1, where a member of the set of n erasure codes has an associated read probability that describes how likely the member is to be read.

5. The non-transitory computer-readable storage medium of claim 4, where the first subset is selected so that members of the set of n erasure codes having a read probability above a threshold are stored on the first data store.

6. The non-transitory computer-readable storage medium of claim 5, where the second subset is selected so that members of the set of n erasure codes having a read probability below a threshold are stored on the second data store.

7. The non-transitory computer-readable storage medium of claim 1,
where the set of n erasure codes are systematic erasure codes,
where a k sized subset of the n erasure codes are erasure codes from which the message m can be reconstructed without decoding an erasure code, and
where an n-k sized subset of the n erasure codes that is mutually exclusive with the k sized subset are erasure codes from which the message m can be reconstructed based, at least in part, on decoded members of the n-k sized subset.

8. The non-transitory computer-readable storage medium of claim 7, where the first subset is the k sized subset and the second subset is the n-k sized subset.

9. The non-transitory computer-readable storage medium of claim 7, where the first subset includes at least the k sized subset and the second subset includes at least the n-k sized subset.

10. The non-transitory computer-readable storage medium of claim 9,
where a member of the set of n erasure codes has an associated read probability that describes how likely the member is to be read,
where the first subset is selected so that members of the set of n erasure codes having a read probability above a threshold are stored on the first data store, and
where the second subset is selected so that members of the set of n erasure codes having a read probability below a threshold are stored on the second data store.

11. The non-transitory computer-readable storage medium device of claim 1, the method comprising causing the first subset to be stored on the first data store and causing the second subset to be stored on the second data store.

12. The non-transitory computer-readable storage medium of claim 1, the method comprising selectively powering down the second data store after the second subset has been stored on the second data store.

13. The non-transitory computer-readable storage medium of claim 1, where the first data store and the second store are located on the same data storage device.

14. The non-transitory computer-readable storage medium of claim 1, where the first data store and the second data store are located on different data storage devices.

15. The non-transitory computer-readable storage medium of claim 1, where the first subset and the second subset are mutually exclusive.

16. The non-transitory computer-readable storage medium of claim 1, where the first subset and the second subset are selected to maximize a utility measure that is a function of an erasure code read time, an erasure code write time, or an erasure code storage cost.

17. An apparatus, comprising:
a processor;
a memory;
a set of logics that control how erasure codes are stored on a plurality of data storage devices; and
an interface that connects the processor, the memory, and the set of logics;
the set of logics comprising:
a first logic that produces a characterization of a plurality of operating parameters for the plurality of data storage devices, where the plurality of operating parameters includes write speed and one or more of read speed, storage capacity, or storage cost, where the first logic produces a ranking of the plurality of data storage devices with respect to the plurality of parameters; and
a second logic that selectively causes the erasure codes to be stored on different members of the plurality of data storage devices based, at least in part, on the characterization of the plurality of operating parameters, and the ranking.

18. The apparatus of claim 17, where the plurality of data storage devices include a hard disk drive, a solid state drive, a tape drive, or a virtual storage device located in the cloud.

19. The apparatus of claim 17, where the second logic causes the erasure codes to be stored on selected members of the plurality of data storage devices to maximize a read utility measure.

20. The apparatus of claim 19, where the read utility measure is a function of a probability that an erasure code will be read and a time required to read the erasure code.

21. The apparatus of claim 17, comprising a third logic that produces a re-characterization of the plurality of operating parameters for the plurality of data storage devices and causes the second logic to selectively move an erasure code from a current data storage device to a different data storage device based, at least in part, on the re-characterization.

22. A method, comprising:
accessing a set of systematic erasure codes;
producing a ranking of a first data store and a second data store, where the ranking is based on an operating parameter of the first data store and an operating parameter of the second data store;
selectively storing members of the set of systematic erasure codes from which a message can be reconstructed without erasure code decoding on the first data store based, at least in part, on the ranking; and
selectively storing members of the set of systematic erasure codes from which the message can be reconstructed using erasure code decoding on the second data store, based, at least in part on the ranking, where the second subset includes less than enough erasure codes to reconstruct the message, and where the second subset is stored, at least in part, in an unencrypted fashion, where a member of the set of systematic erasure codes can be read from the first data store faster than from the second data store.

23. The method of claim 22, where the first data store is a solid state drive and the second data store is a hard disk drive.

24. The method of claim 22, where the first data store is a hard disk drive and the second data store is a tape.

25. The method of claim 22, where the first data store is a hard disk drive and the second data store is in the cloud.

26. The method of claim 22, where the first data store is located on cylinders closer to the outside of a hard disk drive than cylinders on the hard disk drive associated with the second data store.

27. The method of claim 22, where the second data store is a publicly accessible data store.

28. The method of claim 27, where the second data store resides in the cloud.

* * * * *